(12) United States Patent
Gao et al.

(10) Patent No.: US 9,811,416 B2
(45) Date of Patent: Nov. 7, 2017

(54) MEMORY ACCESS METHOD AND APPARATUS FOR MESSAGE-TYPE MEMORY MODULE

(71) Applicant: HUAWEI TECHNOLOGIES CO., LTD., Shenzhen (CN)

(72) Inventors: Xiang Gao, Beijing (CN); Bing Li, Beijing (CN); Shuchang Shan, Beijing (CN); Yu Hu, Beijing (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/010,326

(22) Filed: Jan. 29, 2016

(65) Prior Publication Data

US 2016/0147600 A1 May 26, 2016

Related U.S. Application Data

(63) Continuation of application No. PCT/CN2014/083464, filed on Jul. 31, 2014.

(30) Foreign Application Priority Data

Jul. 31, 2013 (CN) .......................... 2013 1 0330220

(51) Int. Cl.
 *G11C 29/00* (2006.01)
 *G06F 11/10* (2006.01)
 *G11C 29/52* (2006.01)
(52) U.S. Cl.
 CPC ........ *G06F 11/1068* (2013.01); *G06F 11/108* (2013.01); *G06F 11/1044* (2013.01); *G11C 29/52* (2013.01)

(58) Field of Classification Search
 None
 See application file for complete search history.

(56) References Cited

U.S. PATENT DOCUMENTS

| 6,785,835 B2 | 8/2004 | Maclaren et al. |
| 2004/0003337 A1* | 1/2004 | Cypher .................. G11C 29/42 714/763 |

(Continued)

FOREIGN PATENT DOCUMENTS

| CN | 102203740 A | 9/2011 |
| CN | 102456394 A | 5/2012 |

(Continued)

OTHER PUBLICATIONS

Chinese Office Action dated Nov. 30, 2016 in corresponding Chinese Patent Application No. 201310330220.6.

(Continued)

*Primary Examiner* — Daniel McMahon
(74) *Attorney, Agent, or Firm* — Staas & Halsey LLP (57) ABSTRACT

A memory access apparatus includes a read-write module and a processing module. The read-write module is configured to store an error detecting code in an $(M+2)^{th}$ DRAM in the memory row, and store the error correcting code in a $Z^{th}$ DRAM in the memory row, where Z is a positive integer, $1 \leq Z \leq (M+1)$, and error correcting codes in consecutive $(M+1)$ memory rows are stored in different DRAMs. The processing module is configured to calculate one group of error detecting code for each single chip burst cluster (SCBC) in a memory row, and calculate one group of error correcting code for all SCBCs in a memory row.

15 Claims, 3 Drawing Sheets

(56) References Cited

U.S. PATENT DOCUMENTS

| | | | |
|---|---|---|---|
| 2004/0088636 A1* | 5/2004 | Cypher | G06F 13/1668 714/764 |
| 2009/0006886 A1* | 1/2009 | O'Connor | G06F 11/108 714/5.11 |
| 2009/0006900 A1* | 1/2009 | Lastras-Montano | G06F 11/1044 714/42 |
| 2010/0017650 A1 | 1/2010 | Chin et al. | |
| 2011/0066882 A1* | 3/2011 | Walls | G06F 11/1068 714/6.24 |
| 2012/0023364 A1* | 1/2012 | Swanson | G06F 11/1008 714/6.12 |
| 2012/0079318 A1 | 3/2012 | Colgrove et al. | |
| 2012/0099389 A1 | 4/2012 | Park et al. | |
| 2013/0311823 A1* | 11/2013 | Kaplan | G06F 11/2023 714/15 |
| 2014/0013182 A1 | 1/2014 | Cheng et al. | |

FOREIGN PATENT DOCUMENTS

| | | |
|---|---|---|
| CN | 102667738 A | 9/2012 |
| WO | 2011/044515 A2 | 4/2011 |
| WO | 2011/094437 A2 | 8/2011 |
| WO | 2012/081732 A1 | 6/2012 |

OTHER PUBLICATIONS

Extended European Search Report dated Jun. 28, 2016 in corresponding European Patent Application No. 14832194.6.
International Search Report dated Oct. 27, 2014 International Patent Application No. PCT/CN2014/083464.
Dell, Timothy J., "A White Paper on the Benefits of Chipkill-Correct ECC for PC Server Main Memory", IBM Microelectronics Division, International Business Machines Corp., Nov. 19, 1997, United Sates of America, 24 pages.
Rahman et al., "StealthWorks: Emulating Memory Errors", Computer Science Department, University of Pittsburg, Pittsburg, Pennsylvania, USA, 8 pages.
Schroeder et al., "DRAM Errors in the Wild: A large-Scale Field Study", Performance '09, SIGMETRICS, Jun. 15-19, 2009, Seattle, Washington, USA, 12 pages.
Udipi et al., "LOT-ECC: Localized and Tiered Reliability Mechanisms for Commodity Memory Systems", 12 pages.
International Search Report dated Oct. 27, 2014, in corresponding International Application No. PCT/CN2014/083464.

* cited by examiner

MEMORY ACCESS METHOD AND APPARATUS FOR MESSAGE-TYPE MEMORY MODULE

CROSS-REFERENCE TO RELATED APPLICATIONS

This application is a continuation of International Application No. PCT/CN2014/083464, filed on Jul. 31, 2014, which claims priority to Chinese Patent Application No. 201310330220.6, filed on Jul. 31, 2013, both of which are hereby incorporated by reference in their entireties.

TECHNICAL FIELD

Embodiments of the present invention relate to the field of communications technologies, and in particular, to a memory access method and apparatus for a message-type memory module.

BACKGROUND

In a running process of a computer system, reliability of a memory plays a significant role. On one hand, with an increasing quantity of memories configured in the system, a failure rate of a memory system is to increase exponentially; on the other hand, because of an introduction of a low-voltage operating mode, a possibility that an error occurs in a memory increases and a quantity of errors increases.

At present, an error checking and correcting (ECC) memory is a widely adopted memory reliability solution. A basic idea of an ECC memory, that is, a memory module with an ECC check code, is to perform data protection in a basic unit of memory module bit width. That a memory module bit width is 64 bits is used as an example; and each time 64-bit data is written, an 8-bit parity bit is calculated for the data and stored in an independent ECC chip, where the 64-bit data and the 8-bit parity bit form a 72-bit ECC word together; any 1-bit error in the 72-bit ECC word can be corrected in this encoding mode. However, if a 2-bit error occurs, the error can only be detected but cannot be corrected, not to mention a multi-bit error occurs.

The IBM company puts forward a Chipkill memory technology on the basis of the ECC memory. A design principle of a Chipkill memory based on an accumulative effect of memory errors tends to occur in a same dynamic random access memory (Dynamic Random Access Memory, DRAM) chip, and a failure of any DRAM chip can be tolerated in the Chipkill technology. A memory controller (Memory Controller, MC) of the Chipkill memory needs to simultaneously control four dual inline memory modules (Dual Inline Memory Module, DIMM) with ECC to work cooperatively, where a bit width of the MC is formed by four 72-bit ECC words, a 1-bit error can be detected and corrected in each ECC word, a bit width of a DRAM chip in each DIMM needs to be four bits, and by means of careful design, 4-bit input/output of a same DRAM chip are respectively mapped to four different ECC words. By means of such design, even if an error occurs in all data of four pins of a DRAM chip, four different ECC words can recover the data, that is, damage of any DRAM chip in any DIMM can be tolerated in the Chipkill technology. In the Chipkill technology, relatively high reliability is achieved by means of a wider MC bit width and data encoding at a coarser granularity. However, theoretically, this technology can only be applied in a DRAM chip of a 4-bit bit width, and therefore is inflexible; in addition, data encoding at an extremely coarse granularity causes that data read by a DIMM each time is much larger than data requested by actual memory access request, which causes much unnecessary power consumption.

SUMMARY

Embodiments of the present invention provide a memory access method and apparatus for a message-type memory module, so as to provide an error-tolerant memory access solution with low power consumption and high reliability, and and may be implemented at a variable granularity.

According to a first aspect, the present invention provides a memory access apparatus for a message-type memory module, where the memory module includes (M+2) dynamic random access memories DRAMs, where M is equal to 2 to the power of m, m is a positive integer, data that can be accessed in one read-write cycle and stored in each DRAM is referred to as a single chip burst cluster SCBC, and a set of data that can be accessed in a same read-write cycle and stored in all the DRAMs forms a memory row; and the apparatus includes:

a read-write module, configured to store, to a corresponding DRAM, an SCBC to be stored within a current read-write cycle, where the SCBC is located in a current memory row, and the DRAM that is used to store the SCBC does not include an $(M+2)^{th}$ DRAM; and a processing module, configured to: calculate one group of error detecting code for each SCBC in a memory row, and calculate one group of error correcting code for all SCBCs in a memory row; where the read-write module is further configured to: store, in an $(M+2)^{th}$ DRAM in a memory row, an error detecting code that is obtained, through calculation, for the memory row; and store, in a $Z^{th}$ DRAM in a memory row, an error correcting code that is obtained, through calculation, for the memory row, where Z is a positive integer, $1 \leq Z \leq (M+1)$, and error correcting codes in consecutive (M+1) memory rows are stored in different DRAMs.

In a first possible implementation manner, the processing module is further configured to: when a read memory access request is received, instruct the read-write module to read a required SCBC and a corresponding error detecting code from the current memory row, check the read SCBC according to the error detecting code, and determine whether there is an SCBC in which an error occurs; when it is determined that there is an SCBC in which an error occurs, acquire a quantity of SCBCs in which an error occurs; and if there is only one SCBC in which an error occurs, instruct the read-write module to read all data of the memory row, and recover, according to an error correcting code in the memory row and one or more SCBCs in which no error occurs in the memory row, the SCBC in which an error occurs.

With reference to the first aspect, in a second possible implementation manner, the processing module is further configured to: when a write memory access request is received, first determine whether a quantity X of second SCBCs to-be-written is less than or equal to M/2; and if X is less than or equal to M/2, instruct the read-write module to read a first error detecting code and a first error correcting code that are stored in the current memory row, and X first SCBCs stored in X DRAMs into which the second SCBCs are to be written; determine, according to the first error detecting code, whether there is a first SCBC in which an error occurs; and when there is no first SCBC in which an error occurs, calculate second error detecting codes for the X second SCBCs, calculate a second error correcting code according to the first error correcting code, the X first SCBCs, and the X second SCBCs, and instruct the read-write module to write the X second SCBCs, the second error correcting code, and the second error detecting codes into corresponding DRAMs; or if X is greater than M/2, instruct the read-write module to read a first error detecting code and a first error correcting code that are stored in the current memory row, and first SCBCs stored in (M−X) DRAMs into which the second SCBCs should not be written; determine, according to the first error detecting code, whether there is a first SCBC in which an error occurs; and when there is no first SCBC in which an error occurs, calculate second error detecting codes for the X second SCBCs, calculate a second error correcting code according to (M−X) first SCBCs and the X second SCBCs, and instruct the read-write module to write the X second SCBCs, the second error correcting code, and the second error detecting codes into corresponding DRAMs.

With reference to the second possible implementation manner of the first aspect, in a third possible implementation manner, the processing module is further configured to: when it is determined that there is a first SCBC in which an error occurs, acquire a quantity of first SCBCs in which an error occurs; and if there is only one first SCBC in which an error occurs, instruct the read-write module to read all data of the memory row, and recover, according to the first error correcting code in the memory row and one or more other SCBCs in which no error occurs in the memory row, the first SCBC in which an error occurs.

According to a second aspect, the present invention provides a memory access method for a message-type memory module, where the memory module includes (M+2) dynamic random access memories DRAMs, where M is equal to 2 to the power of m, m is a positive integer, data that can be accessed in one read-write cycle and stored in each DRAM is referred to as a single chip burst cluster SCBC, and a set of data that can be accessed in a same read-write cycle and stored in all the DRAMs forms a memory row; and the method includes:

storing, to a corresponding DRAM, an SCBC to be stored within a current read-write cycle, where the SCBC is located in a current memory row, and the DRAM that is used to store the SCBC does not include an (M+2)$^{th}$ DRAM;

calculating one group of error detecting code for each SCBC in a memory row, and calculating one group of error correcting code for all SCBCs in a memory row; and storing, in an (M+2)$^{th}$ DRAM in a memory row, an error detecting code that is obtained, through calculation, for the memory row; and storing, in a Z$^{th}$ DRAM in a memory row, an error correcting code that is obtained, through calculation, for the memory row, where Z is a positive integer, $1 \leq Z \leq (M+1)$, and error correcting codes in consecutive (M+1) memory rows are stored in different DRAMs.

In a first possible implementation manner, the method further includes: when a read memory access request is received, reading a required SCBC and a corresponding error detecting code from the current memory row, checking the read SCBC according to the error detecting code, and determining whether there is an SCBC in which an error occurs; when it is determined that there is an SCBC in which an error occurs, acquiring a quantity of SCBCs in which an error occurs; and if there is only one SCBC in which an error occurs, reading all data of the memory row, and recovering, according to an error correcting code in the memory row and one or more other SCBCs in which no error occurs in the memory row, the SCBC in which an error occurs.

With reference to the second aspect, in a second possible implementation manner, the method further includes: when a write memory access request is received, determining whether a quantity X of second SCBCs to-be-written is less than or equal to M/2; and if X is less than or equal to M/2, reading a first error detecting code and a first error correcting code that are stored in the current memory row, and X first SCBCs stored in X DRAMs into which the second SCBCs are to be written; determining, according to the first error detecting code, whether there is a first SCBC in which an error occurs; and when there is no first SCBC in which an error occurs, calculating second error detecting codes for the X second SCBCs, calculating a second error correcting code according to the first error correcting code, the X first SCBCs, and the X second SCBCs, and writing the X second SCBCs, the second error correcting code, and the second error detecting codes into corresponding DRAMs; or if X is greater than M/2, reading a first error detecting code and a first error correcting code that are stored in the current memory row, and first SCBCs stored in (M−X) DRAMs into which the second SCBCs should not be written; determining, according to the first error detecting code, whether there is a first SCBC in which an error occurs; and when there is no first SCBC in which an error occurs, calculating second error detecting codes for the X second SCBCs, calculating a second error correcting code according to (M−X) first SCBCs and the X second SCBCs, and writing the X second SCBCs, the second error correcting code, and the second error detecting codes into corresponding DRAMs.

With reference to the second possible implementation manner of the first aspect, in a third possible implementation manner, after the determining whether there is an SCBC in which an error occurs, the method further includes: acquiring a quantity of first SCBCs in which an error occurs; and if there is only one first SCBC in which an error occurs, reading all data of the memory row, and recovering, according to the first error correcting code in the memory row and one or more other SCBCs in which no error occurs in the memory row, the first SCBC in which an error occurs.

According to the technical solutions in the embodiments of the present invention, fine-granularity encoding protection is performed in a basic read-write unit of SCBC; however, a size of the SCBC is not particularly limited, that is, a bit width and a burst length of a DRAM chip are not limited. Therefore, variable-granularity memory access can be supported. In addition, error detecting can be implemented for different memory access granularities by using an independent DRAM to store an error detecting code, and by means of coordination between an error detecting code and an error correcting code, error-correcting can be implemented for any multi-bit error in a single DRAM, which is a solution with low power consumption and high reliability.

BRIEF DESCRIPTION OF DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Embodiments of the present invention provide a memory access method for a message-type memory module, so as to provide an error-tolerant memory access solution with low power consumption, high reliability, and a variable granularity. The embodiments of the present invention further provide a corresponding apparatus. Details are separately illustrated in the following.

Embodiment 1

Figure 1:
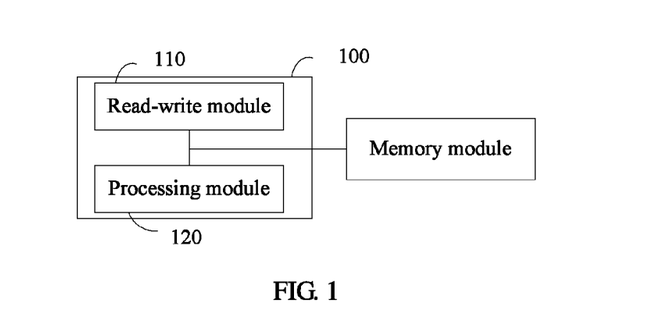
FIG. 1 is a schematic diagram of a memory access apparatus for a message-type memory module according to an embodiment of the present invention.

Referring to FIG. 1, this embodiment of the present invention provides a memory access apparatus 100 for a message-type memory module. The apparatus may be deployed in a peripheral control circuit of the memory module, or may be deployed in a memory controller; and the memory controller may be integrated into a central processing unit (Central Processing Unit, CPU) or integrated into a main board of a computer.

The mentioned memory module may be specifically a DIMM, where the DIMM includes multiple DRAMs. In this specification, it is assumed that a bit width of a DRAM is N bits, where N is equal to $n_{th}$ power of 2, and n is a positive integer; and a burst length (Burst Length, BL) of the DRAM is Q, where Q is a positive integer, and preferably, Q is equal to a certain number of power of 2, for example, Q is equal to 4 or 8. It is assumed that the DIMM includes (M+2) DRAMs, where (M×N) is a bit width of the entire memory module. A bit width (M×N) of a memory module in a computer generally is a certain number of 2, for example, usually 32 or 64; therefore, M is also a certain number of the power of 2, where it may be denoted that M is equal to a $m_{th}$ power of 2, and m is a positive integer. When the bit width of the memory module in the computer has been determined, a quantity of required DRAMs may be determined according to a bit width of a single DRAM.

In this embodiment, data that can be accessed in one read-write cycle and stored in each DRAM is referred to as a single chip burst cluster (Single Chip Burst Cluster, SCBC), each SCBC includes data of (N×Q) bits, and a set of data that can be accessed in a same read-write cycle and stored in all the DRAMs forms a memory row. Each DRAM may also be considered as a memory column, that is, one memory row represents one read-write cycle and one memory column represents one DRAM.

The mentioned memory access apparatus 100 includes a read-write module 110 and a processing module 120. The read-write module 110 is configured to store, to a corresponding DRAM, an SCBC to be stored within a current read-write cycle, where the SCBC is located in a current memory row, the DRAM that is used to store the SCBC does not include an $(M+2)^{th}$ DRAM, and a quantity of SCBCs to be stored within one read-write cycle does not exceed M.

The processing module 120 is configured to: calculate one group of error detecting code for each SCBC in a memory row, and calculate one group of error correcting code for all SCBCs in a memory row.

The read-write module 110 is further configured to: store, in an $(M+2)^{th}$ DRAM in a memory row, an error detecting code that is obtained, through calculation, for the memory row; and store, in a $Z^{th}$ DRAM in a memory row, an error correcting code that is obtained, through calculation, for the memory row, where Z is a positive integer, $1 \leq Z \leq (M+1)$, and error correcting codes in consecutive (M+1) memory rows are stored in different DRAMs.

Optionally, the processing module 120 is further configured to: when a read memory access request is received, instruct the read-write module 110 to read a required SCBC and a corresponding error detecting code from the current memory row, check the read SCBC according to the error detecting code, and determine whether there is an SCBC in which an error occurs; when it is determined that there is an SCBC in which an error occurs, acquire a quantity of SCBCs in which an error occurs; and if there is only one SCBC in which an error occurs, instruct the read-write module to read all data of the memory row, and recover, according to an error correcting code in the memory row and one or more other SCBCs in which no error occurs in the memory row, the SCBC in which an error occurs. If there are two or more SCBCs in which an error occurs, the processing module 120 reports an unrecoverable error to a controlling device, such as a memory controller.

Optionally, the processing module 120 is further configured to: first determine whether a quantity X of second SCBCs to-be-written is less than or equal to M/2 when receiving a write memory access request; and if X is less than or equal to M/2, instruct the read-write module to read a first error detecting code and a first error correcting code that are stored in the current memory row, and X first SCBCs stored in X DRAMs into which the second SCBCs are to be written; determine, according to the first error detecting code, whether there is a first SCBC in which an error occurs; and when there is no first SCBC in which an error occurs, calculate second error detecting codes for the X second SCBCs, calculate a second error correcting code according to the first error correcting code, the X first SCBCs, and the X second SCBCs, and instruct the read-write module to write the X second SCBCs, the second error correcting code, and the second error detecting codes into corresponding DRAMs; or if X is greater than M/2, instruct the read-write module to read a first error detecting code and a first error correcting code that are stored in the current memory row, and first SCBCs stored in (M−X) DRAMs into which the second SCBCs should not be written; determine, according to the first error detecting code, whether there is a first SCBC in which an error occurs; and when there is no first SCBC in which an error occurs, calculate second error detecting codes for the X second SCBCs, calculate a second error correcting code according to (M−X) first SCBCs and the X second SCBCs, and instruct the read-write module to write the X second SCBCs, the second error correcting code, and the second error detecting codes into corresponding DRAMs.

Further, the processing module 120 is further configured to: when it is determined that there is a first SCBC in which an error occurs, acquire a quantity of first SCBCs in which an error occurs; and if there is only one first SCBC in which an error occurs, instruct the read-write module to read all data of the memory row, and recover, according to the first error correcting code in the memory row and one or more other SCBCs in which no error occurs in the memory row, the first SCBC in which an error occurs. When there are SCBCs, in which an error occurs, in more than two DRAMs, the processing module 120 reports an unrecoverable error to a controlling device, such as a memory controller.

The foregoing first SCBCs, first error correcting code, and first error detecting code may be understood as SCBCs, an error correcting code, and an error detecting code that are currently stored. The second SCBCs, the second error correcting code, and the second error detecting codes are SCBCs, an error correcting code, and error detecting codes, where the SCBCs, the error correcting code, and the error detecting codes are to be rewritten; and the data is to overwrite the foregoing first SCBCs, first error correcting code, and first error detecting code.

Generally, at present, a memory module in a computer system is usually 64 bits. If a DRAM whose bit width N is 8 is selected, a quantity of DRAMs that are used to store SCBCs should be 8 that is obtained by dividing 64 by 8. In the following, an example in which both M and N are equal to 8 is used to illustrate the apparatus in this embodiment of the present invention in further detail.

Figure 2:
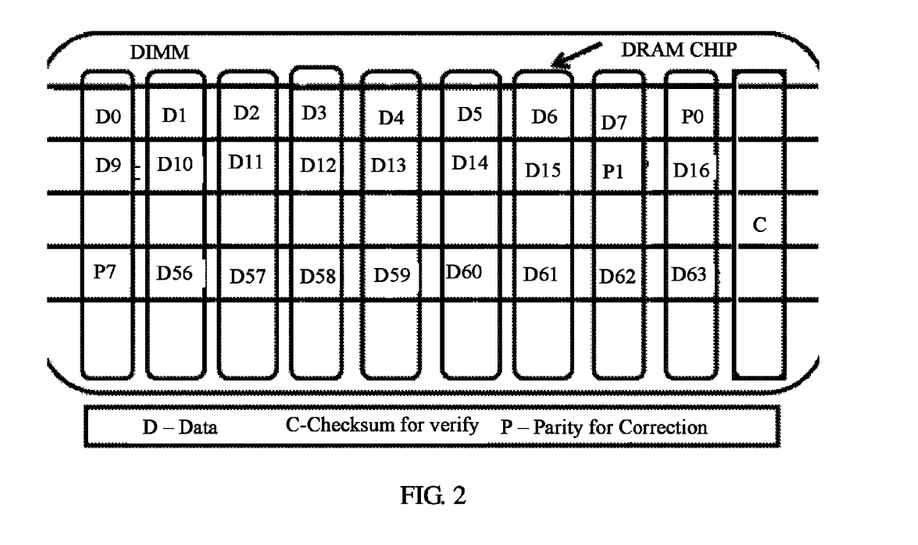
FIG. 2 is a principle diagram of a memory access apparatus for a message-type memory module according to an embodiment of the present invention.

When both M and N are equal to 8, a data encoding structure of the memory module is shown in FIG. 2, where 10 columns in the figure respectively represent a first DRAM to an $(M+2)^{th}$ DRAM. The $(M+2)^{th}$ DRAM, that is, the last column in the figure, is used to store an error detecting code, one DRAM in the first DRAM to an $(M+1)^{th}$ DRAM is used to store an error correcting code, and the other eight DRAMs are used to store SCBCs. If a burst length of each DRAM is also 8 bits, each SCBC includes data of 64 bits that are obtained by 8bit*8. In the figure, Data (D) is used to represent memory access data, Parity (P) is used to represent an error correcting code, and Checksum (C) is used to represent an error detecting code. SCBCs stored in a same memory row are respectively represented by D0 to D7, error correcting codes stored in consecutive (M+1) memory rows are respectively represented by P0 to P8, and error detecting codes stored in the consecutive (M+1) memory rows are respectively represented by C0 to C8. In a broad sense, the memory access data, the error correcting code, and the error detecting code are all SCBCs, but in this specification, the SCBC refers to only the memory access data (D).

In this embodiment, an error-tolerant code is divided into two parts: an error detecting code and an error correcting code. Calculation for the error detecting code includes: successively calculating a checksum of eight SCBCs in a same memory row, where an 8-bit modulo-2 addition operation or a sum of 8-bit binary ones' complement code may be adopted in the calculation for the checksum, an 8-bit check code is obtained, through calculation, for each SCBC, and a 64-bit check code is obtained, through calculation, for eight SCBCs in a same row, where the 64-bit check code is stored at a corresponding location in a first memory row of a dedicated $(M+2)^{th}$ DRAM chip, and is used as the error detecting code. Calculation for the error correcting code includes: performing an XOR operation on corresponding bits of eight SCBCs in a same memory row, and generating a 64-bit parity check code after the operation, that is, the error correcting code P, for example, an error correcting code P0 is obtained after an XOR operation is performed on corresponding bits of D0 to D7, and the error correcting code P0 is stored in the (M+1)th DRAM in the same row a same row as the $(M+1)^{th}$ DRAM. It should be noted that error correcting codes of multiple consecutive memory rows are stored in different DRAMs, and are distributed, in a strip shape, in memory data areas of the first DRAM to the $(M+1)^{th}$ DRAM for error correcting.

Reasons for design of strip-shaped distribution of the error correcting codes are as follows: If the error correcting codes P of all memory rows are stored in a same DRAM chip, the error correcting codes P at corresponding locations in the chip need to be updated when data is written continuously, which makes the DRAM chip become an access hotspot, so that a delay between two write operations increases and update performance is degraded; in addition, when the error correcting code P is to be written, all data stored in the entire memory row needs to be pre-read, which further causes performance degradation. However, the foregoing problems can be solved by means of strip-shaped distribution of the error correcting codes.

Detailed configuration parameters of the error-tolerant code are shown in Table 1.

TABLE 1

| Function | Error detecting | Error correcting |
|---|---|---|
| Protection scope | single chip burst cluster (SCBC) | Any SCBC, in which an error occurs, in a same row (Chipkill function: multi-error correcting on any single chip) |
| Protection size | 8bit * 8 = 64 bit (8 byte) | Any 8 bits in 64 bit * 8 chips = 512 bit (any 1 byte in 64 byte) |
| Encoding mode | 8 bit Checksum (1 byte) | 64 bit Parity (8 byte) |
| Operation delay | Read: RD + CHECK Write: RD + ENCODE + WR | RD + RECOVERY + WR |
| Overhead | 12.5% | 12.5% |

For different memory access requests, the apparatus in this embodiment executes three types of processing: read memory access processing, write memory access processing, and error recovery processing, which are separately illustrated in the following:

A. Read Memory Access Processing

When a read memory access request arrives, the processing module needs to: activate several responsive DRAM chips according to a read granularity, and read SCBC data; at the same time, read an error detecting code in a current memory row, and check the read SCBC data; if there is no SCBC in which an error occurs, continue to read, and upload read data; if there is an SCBC in which an error occurs in only one DRAM chip, perform error recovery processing; and if there is an SCBC in which an error occurs in multiple DRAM chips, report an unrecoverable error to the controlling device. The memory access granularity refers to a quantity of pieces of SCBC data that needs to be accessed.

For example, a read memory access request RD (D0, D1, D2) requests to read D0 to D2, that is, three SCBCs of 24-byte data in total, four DRAM chips need to be activated, D0 to D2 and C0 are read, D0 to D2 are checked according to an error detecting code of the first three bytes of C0, and if an error occurs in any SCBC, error recovery processing is performed.

B. Write Memory Access Processing

When a write memory access request arrives, the processing module first determines a memory access granularity of the write memory access request. The memory access granularity refers to a quantity of pieces of SCBC data that needs to be accessed.

If the memory access granularity of the write memory access request, that is, a quantity X of pieces of to-be-written SCBC data, is less than or equal to M/2, original SCBC data at a location into which data is to be written and specified by the write memory access request is read, and an original error correcting code and an original error detecting code in the row are read together; the read original SCBC data is checked by using the original error detecting code; if there is only one SCBC in which an error occurs, error recovery processing is performed; and if there is no error, an updated new error correcting code P' is obtained after an XOR operation is performed on the original error correcting code P, the read original SCBC data, and new SCBC data to-be-written, a new error detecting code C' is simultaneously calculated for the newly written SCBC data, the read-write module is instructed to write the new SCBC, the new error correcting code, and the new error detecting code into corresponding locations of corresponding DRAMs.

For example, a write memory access request WR (D0', D1', D2') is received and requests to write D0', D1', and D2', that is, three SCBCs of 24-byte data in total, into original locations of D0, D1, and D2; if it is determined that a write granularity of three SCBCs is less than half of the total eight SCBCs, original data D0, D1, and D2, and check codes P0 and C0 in a same row are read first; checking is performed according to C0; if there is no error, new P0'=P0^D0^D1^D2^D0'^D1'^D2' is calculated; and a checksum of D0', D1', and D2' is calculated, C0 is updated to obtain C0', and finally D0', D1', D2', P0', and C0' are written together.

The other case is as follows: If the memory access granularity of the write memory access request, that is, a quantity X of pieces of to-be-written SCBC data, is greater than M/2, SCBC data that should not be modified during this write memory access and is in the memory row is read, and an error correcting code P and an error detecting code C in the row are read together; read original data is checked by using the error detecting code C, and if an error occurs, error recovery processing is performed; and if there is no error, an XOR operation is perform on to-be-written data and the read data that should not be modified and is in the memory row, to obtain an updated error correcting code P', and an error detecting code is simultaneously calculated for the written data and is written into a corresponding location of a corresponding DRAM.

For example, a write memory access request WR (D0', D1', D2', D3', D4', D5') is received and requests to write D0' to D5', that is, six SCBCs of 48-byte data in total, into original locations of D0' to D5'; if it is determined that a write granularity of six SCBCs is greater than half of the total eight SCBCs, data D6 and data D7 in the row that are not modified after being written and check codes P0 and C0 in the same row are read first; checking is performed on D6 and D7 according to C0; if there is no error, new P0'=D0'^D1'^D2'^D3'^D4'^D5'^D6^D7 is calculated; and a checksum of D0' to D5' is calculated, C0 is updated to obtain C0', and finally D0' to D5', P0', and C0' are written together.

In conclusion, before write memory access, data that is less than or equal to half of a bit width needs to be read for one time, and then an error correcting code and an error detecting code are updated and finally written together. The original SCBC data, the original error correcting code, and the original error detecting code refer to SCBC data, an error correcting code, and an error detecting code that are originally stored in the memory module, that is, the first SCBC data, the first error correcting code, and the first error detecting code that are described above; and the new SCBC data, the new error correcting code, and the new error detecting code refer to updated SCBC data, an updated error correcting code, and an updated error detecting code, that is, the second SCBC data, the second error correcting code, and the second error detecting code that are described above.

C. Error Recovery Processing

After data in which an error occurs is detected by using an error detecting code, it needs to further acquire a quantity of SCBCs in which an error occurs; and if errors occur simultaneously in multiple bits in only one SCBC, that is, a case in which errors occur in a single DRAM chip, the apparatus in this embodiment performs error recovery processing. First, all data of a memory row in which the SCBC in which an error occurs is located is read, including an SCBC in which no error occurs, an error detecting code C, and an error correcting code P; other read data in a same row is checked according to the error detecting code C; and if there is no error, an XOR operation is performed on all other SCBCs that are correct and the error correcting code P, so as to perform recovery processing and obtain an entire block of correct data, and finally the correct data is rewritten.

For example, if an error occurs in D0 and D0 needs to be recovered, D1 to D7, P0, and C0 in a same memory row are read first; D1 to D7 are checked by using an error detecting code C0; if an error occurs in other SCBC data, an unrecoverable error is reported to a device; and if D1 to D7 are correct, D0'=D1^D2^D3^D4^D5^D6^D7^P0 is calculated, and a correct D0' is obtained; and finally the correct data D0' is written. Up to this, the recovery ends.

Specific configuration in the technical solution in this embodiment of the present invention is flexible, and according to different architecture design, a size of an encoding granularity can be set by adjusting a bit width of a used chip, a burst length of the chip, and a quantity of groups of burst length clusters. For design of error-tolerant memory access encoding at a finer granularity, design of an x4-bit width and a 4-bit burst length may be used, so that a capacity of an SCBC is reduced to 16 bits. For design of error-tolerant memory access encoding at a coarser granularity, design of an x16-bit width together with two groups of 8-bit burst lengths may be used, and at least data of 256 bits is read once by using two write-read cycles. In some implementation manners, design of an x8-bit width and a 4-bit burst length may also be used, so that a capacity of an SCBC is reduced to 32 bits; or design of an x16-bit width and a 8 bit burst length may be used, so that a capacity of an SCBC is reduced to 128 bits; or another manner may be used. In another implementation manner, another combination of a bit width and a burst length may be randomly selected, where the bit width generally is a certain number of the power of 2.

In the foregoing descriptions, this embodiment of the present invention provides the memory access apparatus for a message-type memory module. The apparatus performs fine-granularity encoding protection in a basic read-write unit of SCBC; however, a size of the SCBC is not particularly limited, that is, a bit width and a burst length of a DRAM chip are not limited. Therefore, variable-granularity memory access can be supported, and accessing DRAMs of variable quantities can be supported. In addition, error detecting can be implemented for different memory access granularities by using an independent DRAM to store an error detecting code, and by means of coordination between an error detecting code and an error correcting code, error-correcting can be implemented for any multi-bit error in a single DRAM, which is a solution with low power consumption and high reliability.

According to the technical solution in this embodiment, multi-bit error tolerance in any single chip can be implemented. Compared with the Chipkill technology, a quantity of activated chips during reading and writing each time decreases by 44 to 83% (16 to 30/36), where the decrease of the quantity of activated chip data means that dynamic power consumption decreases proportionally. The present embodiment of the present invention implements error-tolerant protection at a Chipkill level by means of a lower power consumption overhead, has no chip bit width limitation existing in Chipkill, and is easier for expansion. In addition, according to the present patent based on design of a message-type memory, fine granularity protection is implemented, and an error-tolerant granularity is variable, which provides more optimization space for upper-layer architecture design.

Embodiment 2

Figure 3:
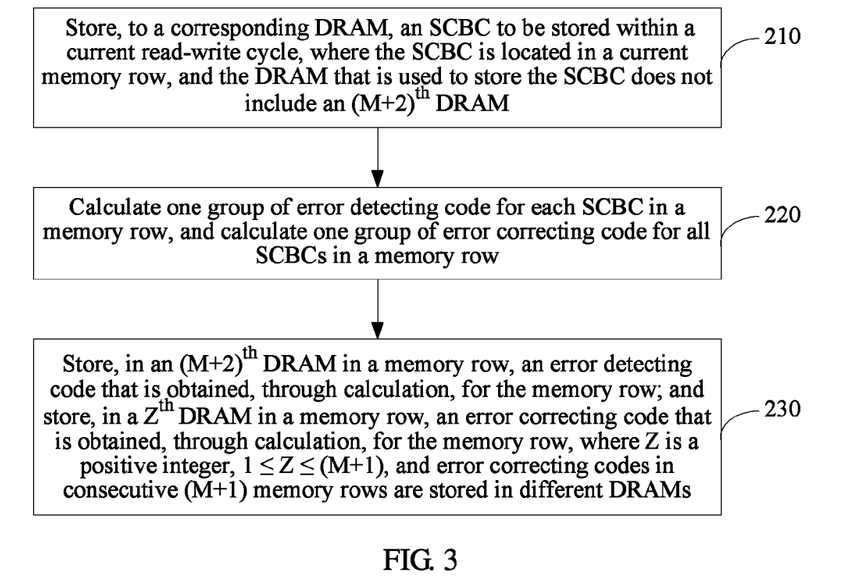
FIG. 3 is a flowchart of a memory access method for a message-type memory module according to an embodiment of the present invention.

Referring to FIG. 3, this embodiment of the present invention provides a memory access method for a message-type memory module. The method is executed by a peripheral control circuit or a memory controller of the memory module, which is specifically the memory access apparatus that is described in Embodiment 1 and deployed in the peripheral control circuit or the memory controller. The memory module includes (M+2) dynamic random access memories (DRAM), where M is equal to 2 to the power of m, m is a positive integer, data that can be accessed in one read-write cycle and stored in each DRAM is referred to as a single chip burst cluster SCBC, and a set of data that can be accessed in a same read-write cycle and stored in all the DRAMs forms a memory row.

The method includes the flowing steps:

210. Store, to a corresponding DRAM, an SCBC to be stored within a current read-write cycle, where the SCBC is located in a current memory row, and the DRAM that is used to store the SCBC does not include an $(M+2)^{th}$ DRAM.

220. Calculate one group of error detecting code for each SCBC in a memory row, and calculate one group of error correcting code for all SCBCs in a memory row.

230. Store, in an $(M+2)^{th}$ DRAM in a memory row, an error detecting code that is obtained, through calculation, for the memory row; and store, in a $Z^{th}$ DRAM in a memory row, an error correcting code that is obtained, through calculation, for the memory row, where Z is a positive integer, $1 \leq Z \leq (M+1)$, and error correcting codes in consecutive (M+1) memory rows are stored in different DRAMs.

Optionally, the method further includes:

when a read memory access request is received, reading a required SCBC and a corresponding error detecting code from the current memory row, checking the read SCBC, and determining, according to the error detecting code, whether there is an SCBC in which an error occurs; when it is determined that there is an SCBC in which an error occurs, acquiring a quantity of SCBCs in which an error occurs; and if there is only one SCBC in which an error occurs, reading all data of the memory row, and recovering, according to an error correcting code in the memory row and one or more other SCBCs in which no error occurs in the memory row, the SCBC in which an error occurs.

Optionally, the method further includes:

when a write memory access request is received, determining whether a quantity X of second SCBCs to-be-written is less than or equal to M/2; and if X is less than or equal to M/2, reading a first error detecting code and a first error correcting code that are stored in the current memory row, and X first SCBCs stored in X DRAMs into which the second SCBCs are to be written; determining, according to the first error detecting code, whether there is a first SCBC in which an error occurs; and when there is no first SCBC in which an error occurs, calculating second error detecting codes for the X second SCBCs, calculating a second error correcting code according to the first error correcting code, the X first SCBCs, and the X second SCBCs, and writing the X second SCBCs, the second error correcting code, and the second error detecting codes into corresponding DRAMs; or if X is greater than M/2, reading a first error detecting code and a first error correcting code that are stored in the current memory row, and first SCBCs stored in (M−X) DRAMs into which the second SCBCs should not be written; determining, according to the first error detecting code, whether there is a first SCBC in which an error occurs; and when there is no first SCBC in which an error occurs, calculating second error detecting codes for the X second SCBCs, calculating a second error correcting code according to (M−X) first SCBCs and the X second SCBCs, and writing the X second SCBCs, the second error correcting code, and the second error detecting codes into corresponding DRAMs.

Optionally, when there is a first SCBC in which an error occurs, the method further includes:

acquiring a quantity of first SCBCs in which an error occurs; and if there is only one first SCBC in which an error occurs, reading all data of the memory row, and recovering, according to the first error correcting code in the memory row and one or more other SCBCs in which no error occurs in the memory row, the first SCBC in which an error occurs.

In the foregoing descriptions, this embodiment of the present invention provides the memory access method for a message-type memory module. In the method, fine-granularity encoding protection is performed in a basic read-write unit of SCBC; however, a size of the SCBC is not particularly limited, that is, a bit width and a burst length of a DRAM chip are not limited. Therefore, variable-granularity memory access can be supported, and accessing DRAMs of variable quantities can be supported. In addition, error detecting can be implemented for different memory access granularities by using an independent DRAM to store an error detecting code, and by means of coordination between an error detecting code and an error correcting code, error-correcting can be implemented for any multi-bit error in a single DRAM, which is a solution with low power consumption and high reliability.

Embodiment 3

This embodiment of the present invention further provides a memory control system.

Figure 4A:
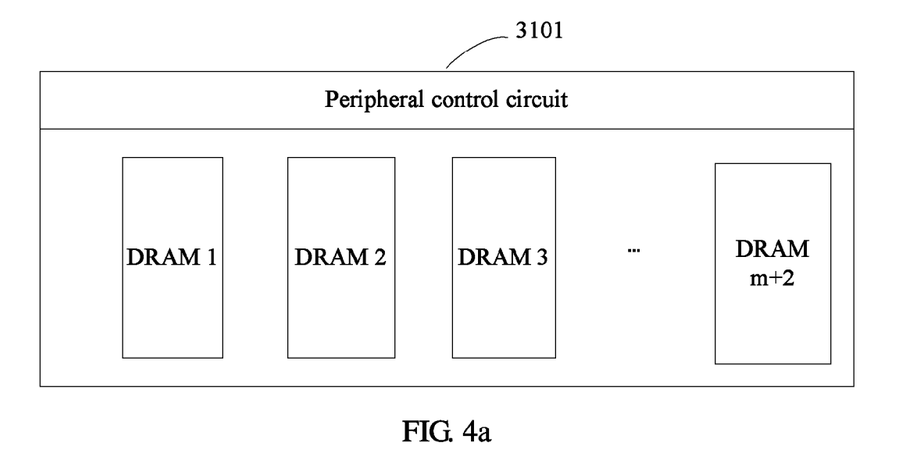
FIG. 4a and FIG. 4b are schematic diagrams of a memory control system according to an embodiment of the present invention.

In an implementation manner, as shown in FIG. 4a, the system includes a message-type memory module 310, where the memory module 310 includes a peripheral control circuit 3101 and (M+2) DRAMs 3102.

M is equal to 2 to the power of m, m is a positive integer, data that can be accessed in one read-write cycle and stored in each DRAM is referred to as a single chip burst cluster SCBC, and a set of data that can be accessed in a same read-write cycle and stored in all the DRAMs forms a memory row. The memory controller may be integrated into a main board of a computer or integrated into a CPU of a computer.

The peripheral control circuit executes the following steps:

storing, to a corresponding DRAM, an SCBC to be stored within a current read-write cycle, where the SCBC is located in a current memory row, and the DRAM that is used to store the SCBC does not include an $(M+2)^{th}$ DRAM; calculating one group of error detecting code for each SCBC in a memory row, and calculating one group of error correcting code for all SCBCs in a memory row; and storing, in an $(M+2)^{th}$ DRAM in a memory row, an error detecting code that is obtained, through calculation, for the memory row, and storing, in a $Z^{th}$ DRAM in a memory row, an error correcting code that is obtained, through calculation, for the memory row, where Z is a positive integer, $1 \leq Z \leq (M+1)$, and error correcting codes in consecutive (M+1) memory rows are stored in different DRAMs.

Optionally, the peripheral control circuit further executes the following steps:

when a read memory access request is received, reading a required SCBC and a corresponding error detecting code from the current memory row, checking the read SCBC, and determining, according to the error detecting code, whether there is an SCBC in which an error occurs; when it is determined that there is an SCBC in which an error occurs, acquiring a quantity of SCBCs in which an error occurs; and if there is only one SCBC in which an error occurs, reading all data of the memory row, and recovering, according to an error correcting code in the memory row and one or more other SCBCs in which no error occurs in the memory row, the SCBC in which an error occurs.

Optionally, the peripheral control circuit further executes the following steps:

when a write memory access request is received, determining whether a quantity X of second SCBCs to-be-written is less than or equal to M/2; and if X is less than or equal to M/2, reading a first error detecting code and a first error correcting code that are stored in the current memory row, and X first SCBCs stored in X DRAMs into which the second SCBCs are to be written; determining, according to the first error detecting code, whether there is a first SCBC in which an error occurs; and when there is no first SCBC in which an error occurs, calculating second error detecting codes for the X second SCBCs, calculating a second error correcting code according to the first error correcting code, the X first SCBCs, and the X second SCBCs, and writing the X second SCBCs, the second error correcting code, and the second error detecting codes into corresponding DRAMs; or if X is greater than M/2, reading a first error detecting code and a first error correcting code that are stored in the current memory row, and first SCBCs stored in (M−X) DRAMs into which the second SCBCs should not be written; determining, according to the first error detecting code, whether there is a first SCBC in which an error occurs; and when there is no first SCBC in which an error occurs, calculating second error detecting codes for the X second SCBCs, calculating a second error correcting code according to (M−X) first SCBCs and the X second SCBCs, and writing the X second SCBCs, the second error correcting code, and the second error detecting codes into corresponding DRAMs; and when there is a first SCBC in which an error occurs, further acquiring a quantity of first SCBCs in which an error occurs; and if there is only one first SCBC in which an error occurs, reading all data of the memory row, and recovering, according to the first error correcting code in the memory row and one or more other SCBCs in which no error occurs in the memory row, the first SCBC in which an error occurs.

Figure 4B:
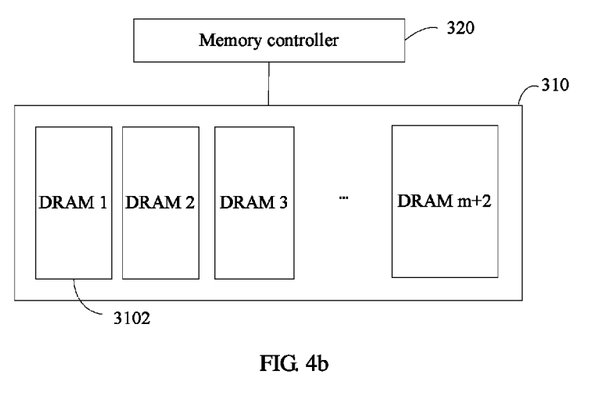

In another implementation manner, as shown in FIG. 4b, the system includes a message-type memory module 310 and a memory controller 320, where the memory module 310 includes (M+2) DRAMs 3102.

M is equal to 2 to the power of m, m is a positive integer, data that can be accessed in one read-write cycle and stored in each DRAM is referred to as a single chip burst cluster SCBC, and a set of data that can be accessed in a same read-write cycle and stored in all the DRAMs forms a memory row. The memory controller may be integrated into a main board of a computer or integrated into a CPU of a computer.

The memory controller executes the following steps: storing, to a corresponding DRAM, an SCBC to be stored within a current read-write cycle, where the SCBC is located in a current memory row, and the DRAM that is used to store the SCBC does not include an $(M+2)^{th}$ DRAM; calculating one group of error detecting code for each SCBC in a memory row, and calculating one group of error correcting code for all SCBCs in a memory row; and storing, in an $(M+2)^{th}$ DRAM in a memory row, an error detecting code that is obtained, through calculation, for the memory row, and storing, in a $Z^{th}$ DRAM in a memory row, an error correcting code that is obtained, through calculation, for the memory row, where Z is a positive integer, $1 \leq Z \leq (M+1)$, and error correcting codes in consecutive (M+1) memory rows are stored in different DRAMs.

Optionally, the memory controller further executes the following steps:

when a read memory access request is received, reading a required SCBC and a corresponding error detecting code from the current memory row, checking the read SCBC, and determining, according to the error detecting code, whether there is an SCBC in which an error occurs; when it is determined that there is an SCBC in which an error occurs, acquiring a quantity of SCBCs in which an error occurs; and if there is only one SCBC in which an error occurs, reading all data of the memory row, and recovering, according to an error correcting code in the memory row and one or more other SCBCs in which no error occurs in the memory row, the SCBC in which an error occurs.

Optionally, the memory controller further executes the following steps:

when a write memory access request is received, determining whether a quantity X of second SCBCs to-be-written is less than or equal to M/2; and if X is less than or equal to M/2, reading a first error detecting code and a first error correcting code that are stored in the current memory row, and X first SCBCs stored in X DRAMs into which the second SCBCs are to be written; determining, according to the first error detecting code, whether there is a first SCBC in which an error occurs; and when there is no first SCBC in which an error occurs, calculating second error detecting codes for the X second SCBCs, calculating a second error correcting code according to the first error correcting code, the X first SCBCs, and the X second SCBCs, and writing the X second SCBCs, the second error correcting code, and the second error detecting codes into corresponding DRAMs; or if X is greater than M/2, reading a first error detecting code and a first error correcting code that are stored in the current memory row, and first SCBCs stored in (M−X) DRAMs into which the second SCBCs should not be written; determining, according to the first error detecting code, whether there is a first SCBC in which an error occurs; and when there is no first SCBC in which an error occurs, calculating second error detecting codes for the X second SCBCs, calculating a second error correcting code according to (M−X) first SCBCs and the X second SCBCs, and writing the X second SCBCs, the second error correcting code, and the second error detecting codes for corresponding DRAMs; and when there is a first SCBC in which an error occurs, further acquiring a quantity of first SCBCs in which an error occurs; and if there is only one first SCBC in which an error occurs, reading all data of the memory row, and recovering, according to the first error correcting code in the memory row and one or more other SCBCs in which no error occurs in the memory row, the first SCBC in which an error occurs.

In the foregoing descriptions, this embodiment of the present invention provides the memory control system. a memory module performs fine-granularity encoding protection in a basic read-write unit of SCBC; however, a size of the SCBC is not particularly limited, that is, a bit width and a burst length of a DRAM chip are not limited. Therefore, variable-granularity memory access can be supported, and accessing DRAMs of variable quantities can be supported. In addition, error detecting can be implemented for different memory access granularities by using an independent DRAM to store an error detecting code, and by means of coordination between an error detecting code and an error correcting code, error-correcting can be implemented for any multi-bit error in a single DRAM, which is a solution with low power consumption and high reliability.

It may be clearly understood by a person skilled in the art that, for the purpose of convenient and brief description, division of the foregoing functional modules is used as an example for illustration. In actual application, the foregoing functions can be allocated to different functional modules and implemented according to a requirement, that is, an inner structure of an apparatus is divided into different functional modules to implement all or some of the functions described above. For a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the module or unit division is merely logical function division and may be other division in actual implementation. For example, multiple units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on multiple network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present application essentially, or the part contributing to the prior art, or all or some of the technical solutions may be implemented in a form of a software product. The software product is stored in a storage medium and includes several instructions for instructing a computer device (which may be a personal computer, a server, or a network device) or a processor (processor) to execute all or some of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

A person of ordinary skill in the art may understand that all or some of the steps of the methods in the foregoing embodiments may be implemented by hardware or a program instructing related hardware. The program may be stored in a computer readable storage medium. The storage medium may include: a read-only memory, a random-access memory, a magnetic disk, or an optical disc.

The memory access method and apparatus for a message-type memory module provided in the embodiments of the present invention are illustrated in detail in the foregoing; however, descriptions of the foregoing embodiments are merely intended to help understand the method and core ideas of the present invention, but should not be understood as a limitation to the present invention. Any variation or replacement readily figured out by a person skilled in the art within the technical scope disclosed in the present invention shall fall within the protection scope of the present invention.

What is claimed is:

1. A memory access apparatus for a message-type memory module, wherein
the memory module comprises (M+2) dynamic random access memories (DRAMs), wherein M is equal to $m_{th}$ power of 2, m is a positive integer, data accessed in one read-write cycle and stored in each DRAM forms a single chip burst cluster (SCBC), and the SCBCs accessed in one read-write cycle of all the DRAMs form a memory row; and
the apparatus comprises:
a read-write module, configured to store a to-be-stored SCBC to a current memory row of a corresponding DRAM of the to-be-stored SCBC within a current read-write cycle, wherein an $(M+2)^{th}$ DRAM is not used to store the SCBC; and
a processing module, configured to: calculate an error detecting code for each SCBC in one memory row respectively, and calculate an error correcting code for all the SCBCs in one memory row; wherein
the read-write module is further configured to: store the calculated detecting codes in the $(M+2)^{th}$ DRAM of the memory row, and store, the calculated error correcting code of the memory row in a $Z^{th}$ DRAM, wherein Z is a positive integer, $1 \leq Z \leq (M+1)$, and error correcting codes in consecutive (M+1) memory rows are stored in different DRAMs, wherein
the processing module is further configured to: determine whether a quantity of second SCBCs to-be-written X is less than or equal to M/2 when a write memory access request is received; and
if X is less than or equal to M/2, instruct the read-write module to read X first SCBCs stored in X DRAMs into which the second SCBCs are to be written, and X first error detecting codes of the X first SCBCs and a first error correcting code of current memory row; determine, according to the X first error detecting codes, whether there is a first SCBC with error; and when there is no first SCBC with error, calculate second error detecting codes for the X second SCBCs, calculate a second error correcting code according to the first error correcting code, the X first SCBCs, and the X second SCBCs, and instruct the read-write module to write the X second SCBCs, the second error correcting codes, and the second error detecting codes into corresponding DRAMs.

2. The apparatus according to claim 1, wherein the processing module is further configured to: instruct the read-write module to read a required SCBC and a corresponding error detecting code from the current memory row when a read memory access request is received, check the read SCBC according to the error detecting code, and determine whether there are SCBCs with error; when it is determined that there are SCBCs with error, acquire a quantity of SCBCs with error; and if there is only one SCBC with error, instruct the read-write module to read all data of the current memory row, and recover the SCBC with error according to an error correcting code and other SCBCs without error in the current memory row.

3. The apparatus according to claim 1
if X is greater than M/2, instruct the read-write module to read first SCBCs stored in (M−X) DRAMs into which the second SCBCs should not be written, first error detecting code of the first-SCBCs and a first error correcting code of the current memory row; determine, according to the first error detecting codes, whether there is a first SCBC with error; and when there is no first SCBC with error, calculate second error detecting codes for the X second SCBCs, calculate a second error correcting code according to (M−X) first SCBCs and the X second SCBCs, and instruct the read-write module to write the X second SCBCs, the second error correcting code, and the second error detecting codes into corresponding DRAMs.

4. The apparatus according to claim 1, wherein
the processing module is further configured to: when it is determined that there are first SCBCs with error, acquire a quantity of the first SCBCs with error; and if there is only one first SCBC with error, instruct the read-write module to read all data of the memory row, and recover the first SCBC with error according to the first error correcting code and one or more other SCBCs without error in the memory row.

5. A memory access method for a message-type memory module, wherein
the memory module comprises (M+2) dynamic random access memories DRAMs, wherein M is equal to $m_{th}$ power of 2, m is a positive integer, data accessed in one read-write cycle and stored in each DRAM forms a single chip burst cluster (SCBC), and the SCBCs accessed in one read-write cycle of all the DRAMs form a memory row; and
the method comprises:
storing a to-be-stored SCBC to a current memory row of a corresponding DRAM of the to-be-stored SCBC within a current read-write cycle, wherein an $(M+2)^{th}$ DRAM is not used to store the SCBC;
calculating an error detecting code for each SCBC in a memory row respectively, and calculating an error correcting code for all the SCBCs in one memory row;
storing the calculated error detecting codes in an $(M+2)^{th}$ DRAM of the memory row; and storing the calculated error correcting code of the memory row in a $Z^{th}$ DRAM, wherein Z is a positive integer, $1 \leq Z \leq (M+1)$, and error correcting codes in consecutive (M+1) memory rows are stored in different DRAMs;
determining whether a quantity of second SCBCs to-be-written X is less than or equal to M/2 when a write memory access request is received; and if X is less than or equal to M/2, reading X first SCBCs stored in X DRAMs into which the second SCBCs are to be written, and X first error detecting codes of the X first SCBCs and a first error correcting code of current memory row;
determining, according to the X first error detecting codes, whether there is a first SCBC with error; and when there is no first SCBC with error, calculating second error detecting codes for the X second SCBCs, calculating a second error correcting code according to the first error correcting code, the X first SCBCs, and the X second SCBCs, and writing the X second SCBCs, the second error correcting codes, and the second error detecting codes into corresponding DRAMs.

6. The method according to claim 5, further comprising:
reading a required SCBC and a corresponding error detecting code from the current memory row when a read memory access request is received;
checking the read SCBCs according to the error detecting codes;
determining whether there are SCBCs with error;
acquiring a quantity of SCBCs with error when it is determined that there are SCBCs with error;
reading all data of the memory row if there is only one SCBC with error, and
recovering the SCBC with according to an error correcting code in the memory row and one or more other SCBCs in which no error occurs in the memory row.

7. The method according to claim 5, further comprising:
if X is greater than M/2, reading first SCBCs stored in (M−X) DRAMs into which the second SCBCs should not be written, first error detecting code of the first SCBCs and a first error correcting code of the current memory row;
determining, according to the first error detecting code, whether there is a first SCBC with error; and
when there is no first SCBC with error, calculating second error detecting codes for the X second SCBCs, calculating a second error correcting code according to (M−X) first SCBCs and the X second SCBCs, and writing the X second SCBCs, the second error correcting code, and the second error detecting codes into corresponding DRAMs.

8. The method according to claim 5, after the determining whether there are first SCBCs with error, further comprising:
acquiring a quantity of the first SCBCs with error; and if there is only one first SCBC with error, reading all the data of the memory row, and recovering the first SCBC with error according to the first error correcting code and one or more other SCBCs without error in the memory row.

9. A memory access system comprising:
a memory module comprising (M+2) dynamic random access memories (DRAMs), wherein M is equal to $m_{th}$ power of 2, m is a positive integer, data accessed in one read-write cycle and stored in each DRAM forms a single chip burst cluster (SCBC), and the SCBCs accessed in one read-write cycle of all the DRAMs form a memory row; and
a memory controller, configured to:
store a to-be-stored SCBC to a current memory row of a corresponding DRAM of the to-be-stored SCBC within a current read-write cycle, wherein an $(M+2)^{th}$ DRAM is not used to store the SCBC;

calculate an error detecting code for each SCBC in one memory row respectively, and calculate an error correcting code for all the SCBCs in one memory row;

store the calculated detecting codes in the $(M+2)^{th}$ DRAM of the memory row; and store, the calculated error correcting code of the memory row in a $Z^{th}$ DRAM, wherein Z is a positive integer, $1 \leq Z \leq (M+1)$, and error correcting codes in consecutive (M+1) memory rows are stored in different DRAMs;

determine whether a quantity of second SCBCs to-be-written X is less than or equal to M/2 when a write memory access request is received; and if X is less than or equal to M/2, read X first SCBCs stored in X DRAMs into which the second SCBCs are to be written, and X first error detecting codes of the X first SCBCs and a first error correcting code of current memory row; determine, according to the X first error detecting codes, whether there is a first SCBC with error; and when there is no first SCBC with error, calculate second error detecting codes for the X second SCBCs, calculate a second error correcting code according to the first error correcting code, the X first SCBCs, and the X second SCBCs, and write the X second SCBCs, the second error correcting codes, and the second error detecting codes into corresponding DRAMs.

10. The system according to claim 9, the memory controller further configured to read a required SCBC and a corresponding error detecting code from the current memory row when a read memory access request is received, check the read SCBC according to the error detecting code, and determine whether there are SCBCs with error; when it is determined that there are SCBC with error, acquire a quantity of SCBCs with error; and if there is only one SCBC with error, read all data of the current memory row, and recover the SCBC with error according to an error correcting code and other SCBCs without error in the current memory row.

11. The system according to claim 9 if X is greater than M/2, to read first SCBCs stored in (M−X) DRAMs into which the second SCBCs should not be written, first error detecting code of the first SCBCs and a first error correcting code of the current memory row; determine, according to the first error detecting codes, whether there is a first SCBC with error; and when there is no first SCBC with error, calculate second error detecting codes for the X second SCBCs, calculate a second error correcting code according to (M−X) first SCBCs and the X second SCBCs, and to write the X second SCBCs, the second error correcting code, and the second error detecting codes into corresponding DRAMs.

12. The system according to claim 9, after determine whether there are first SCBCs with error, the memory controller, further configured to:

acquire a quantity of the first SCBCs with error; and if there is only one first SCBC with error, read all data of the memory row, and recover the first SCBC with error according to the first error correcting code and one or more other SCBCs without error in the memory row.

13. The apparatus according to claim 3, wherein the processing module is further configured to: instruct the read-write module to read a required SCBC and a corresponding error detecting code from the current memory row when a read memory access request is received, check the read SCBC according to the error detecting code, and determine whether there are SCBCs with error; when it is determined that there are SCBCs with error, acquire a quantity of SCBCs with error; and if there is only one SCBC with error, instruct the read-write module to read all data of the current memory row, and recover the SCBC with error according to an error correcting code and other SCBCs without error in the current memory row.

14. The method according to claim 7, further comprising:

reading a required SCBC and a corresponding error detecting code from the current memory row when a read memory access request is received;

checking the read SCBCs according to the error detecting codes;

determining whether there are SCBCs with error;

acquiring a quantity of SCBCs with error when it is determined that there are SCBCs with error;

reading all data of the memory row if there is only one SCBC with error, and recovering the SCBC with according to an error correcting code in the memory row and one or more other SCBCs in which no error occurs in the memory row.

15. The system according to claim 11, the memory controller further configured to read a required SCBC and a corresponding error detecting code from the current memory row when a read memory access request is received, check the read SCBC according to the error detecting code, and determine whether there are SCBCs with error; when it is determined that there are SCBC with error, acquire a quantity of SCBCs with error; and if there is only one SCBC with error, read all data of the current memory row, and recover the SCBC with error according to an error correcting code and other SCBCs without error in the current memory row.

* * * * *